(12) United States Patent
Pallav et al.

(10) Patent No.: US 9,455,127 B2
(45) Date of Patent: Sep. 27, 2016

(54) LASER INDUCED PLASMA MICROMACHINING (LIPMM)

(71) Applicant: Northwestern University, Evanston, IL (US)

(72) Inventors: Kumar Pallav, Sunnyvale, CA (US); Rajiv Malhotra, Corvallis, OR (US); Ishan Saxena, Evanston, IL (US); Kornel Ehmann, Evanston, IL (US); Jian Cao, Wilmette, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 14/681,365

(22) Filed: Apr. 8, 2015

(65) Prior Publication Data

US 2015/0294840 A1 Oct. 15, 2015

Related U.S. Application Data

(60) Provisional application No. 61/979,313, filed on Apr. 14, 2014.

(51) Int. Cl.
  *H01J 37/32* (2006.01)
  *H01J 37/14* (2006.01)
  *H01J 37/30* (2006.01)
  *B23K 26/00* (2014.01)
  *H05H 1/24* (2006.01)
  *H01J 37/302* (2006.01)

(52) U.S. Cl.
  CPC .... *H01J 37/32339* (2013.01); *H01J 37/32669* (2013.01); *H01J 37/32926* (2013.01); *H05H 1/2475* (2013.01); *B23K 26/00* (2013.01); *H01J 37/14* (2013.01); *H01J 37/302* (2013.01); *H01J 37/3266* (2013.01)

(58) Field of Classification Search
  CPC ............. H01J 37/302; H01J 37/32339; H01J 37/3266; H01J 37/14; B23K 26/00
  USPC .............................. 219/121.68, 121.84, 69.11
  See application file for complete search history.

(56) References Cited

U.S. PATENT DOCUMENTS

| 8,546,723 B2 * | 10/2013 | Brown | H01L 21/268 219/121.62 |
| 2008/0257867 A1 * | 10/2008 | Malshe | B81C 1/00492 219/69.14 |
| 2015/0021299 A1 * | 1/2015 | Jensen | B23H 1/04 219/69.17 |

OTHER PUBLICATIONS

D.M. Allen et al., "Ion beam, focused ion beam, and plasma discharge machining," CIRP Annals-Manufacturing Technology (2009), 58:647-662.

(Continued)

*Primary Examiner* — Samuel M Heinrich
(74) *Attorney, Agent, or Firm* — Klintworth & Rozenblat IP LLC

(57) ABSTRACT

A system for laser-induced plasma micromachining of a work-piece includes a dielectric fluid, a dielectric fluid supply device, a laser, a processor, and a memory. The dielectric fluid supply device is arranged to hold a work-piece in the dielectric fluid or to direct the dielectric fluid onto the work-piece. The laser is arranged to emit a pulsed laser-beam. The processor is in electronic communication with the laser. The memory is in electronic communication with the processor. The memory includes programming code for execution by the processor. The programming code is programmed to direct the laser to deliver the pulsed laser-beam into the dielectric fluid to create a plasma generated at a focal point of the pulsed laser-beam in the dielectric fluid to micromachine, using the plasma, the work-piece disposed adjacent to the focal point.

14 Claims, 4 Drawing Sheets

(56) References Cited

OTHER PUBLICATIONS

Y. Hanada, et al., "Laser-induced plasma-assisted ablation (LIPAA): fundamental and industrial applications," Proc. of SPIE (2006), 6261:626111-1-15.

S.S. Harilal, et al., "Confinement and dynamics of laser-produced plasma expanding across a transverse magnetic field," Phys. Rev. E (2004) 69:026413-1-11.

J. Zhang, et al., "Laser-induced plasma-assisted ablation of fused quartz using the fourth harmonic of a Nd+:YAG laser," Appl. Phys. A (1998) 67:545-549.

\* cited by examiner

LASER INDUCED PLASMA MICROMACHINING (LIPMM)

RELATED APPLICATIONS

The disclosure is a utility patent application claiming priority to and the benefit of U.S. provisional patent application Ser. #61/979,313, Laser Induced Plasma Micromachining (LIPMM), filed on Apr. 14, 2014, which is hereby incorporated by reference in its entirety.

GOVERNMENT RIGHTS

This invention was made with government support under grant number CMMI-0969776 awarded by the National Science Foundation. The government has certain rights in the invention.

FIELD OF THE DISCLOSURE

This disclosure relates to systems and methods, for laser-induced plasma micromachining of a work-piece, which emit a laser-beam into a dielectric fluid to create a plasma which micromachines the work-piece.

BACKGROUND

Micro-texturing over large surfaces has been used to achieve required surface properties such as enhanced hydrophobicity, retarded or accelerated bacteria and algae growth, increased light trapping for solar cells, and friction reduction and wear reduction in tools. Among the various micro-textured geometries used for these purposes, micro-channels are the most common. Current laser-based texturing methods are characterized by their inability to machine materials with high surface reflectivity and bulk transmittivity like glass, quartz, and ceramics with a high enough throughput. Moreover, current laser-based machining systems and methods experience other issues such as low material processing rate.

A system and method is needed to reduce or eliminate one or more issues of one or more of the current systems and methods.

SUMMARY

In one embodiment, a system for laser-induced plasma micromachining of a work-piece is disclosed. The system includes a dielectric fluid, a dielectric fluid supply device, a laser, a processor, and a memory. The dielectric fluid supply device is arranged to hold a work-piece in the dielectric fluid or to direct the dielectric fluid onto the work-piece. The laser is arranged to emit a laser-beam. The processor is in electronic communication with the laser. The memory is in electronic communication with the processor. The memory includes programming code for execution by the processor. The programming code is programmed to direct the laser to deliver the laser-beam into the dielectric fluid to create a plasma generated at a focal point of the laser-beam in the dielectric fluid to micromachine, using the plasma, the work-piece disposed adjacent to the focal point.

In another embodiment, a system for laser-induced plasma micromachining of a work-piece is disclosed. The system includes a dielectric fluid, a dielectric fluid supply device, a laser, a processor, and a memory. The dielectric fluid supply device is arranged to hold a work-piece in the dielectric fluid or to direct the dielectric fluid onto the work-piece. The laser is arranged to emit a laser-beam having a wavelength in a visible range, a pulse duration in a range of 1 ps to 1 ns, a pulse frequency of 10 kHz to 50 kHz, and a peak power greater than $10^{11}$ W/cm$^2$. The processor is in electronic communication with the laser. The memory is in electronic communication with the processor. The memory includes programming code for execution by the processor. The code directs the laser to deliver the laser-beam into the dielectric fluid to create a plasma generated at a focal point of the laser-beam inside the dielectric fluid to micromachine, using the plasma, the work-piece disposed adjacent to the focal point.

In still another embodiment, a method of micromachining a work-piece is disclosed. In one step, a laser-beam is emitted from a laser into a dielectric fluid thereby creating a plasma at a focal point of the laser-beam in the dielectric fluid. In another step, a work-piece disposed adjacent to the focal point is micromachined using the plasma.

The scope of the present disclosure is defined solely by the appended claims and is not affected by the statements within this summary.

BRIEF DESCRIPTION OF THE DRAWINGS

The disclosure can be better understood with reference to the following drawings and description. The components in the figures are not necessarily to scale, emphasis instead being placed upon illustrating the principles of the disclosure.

DETAILED DESCRIPTION

Figure 1:
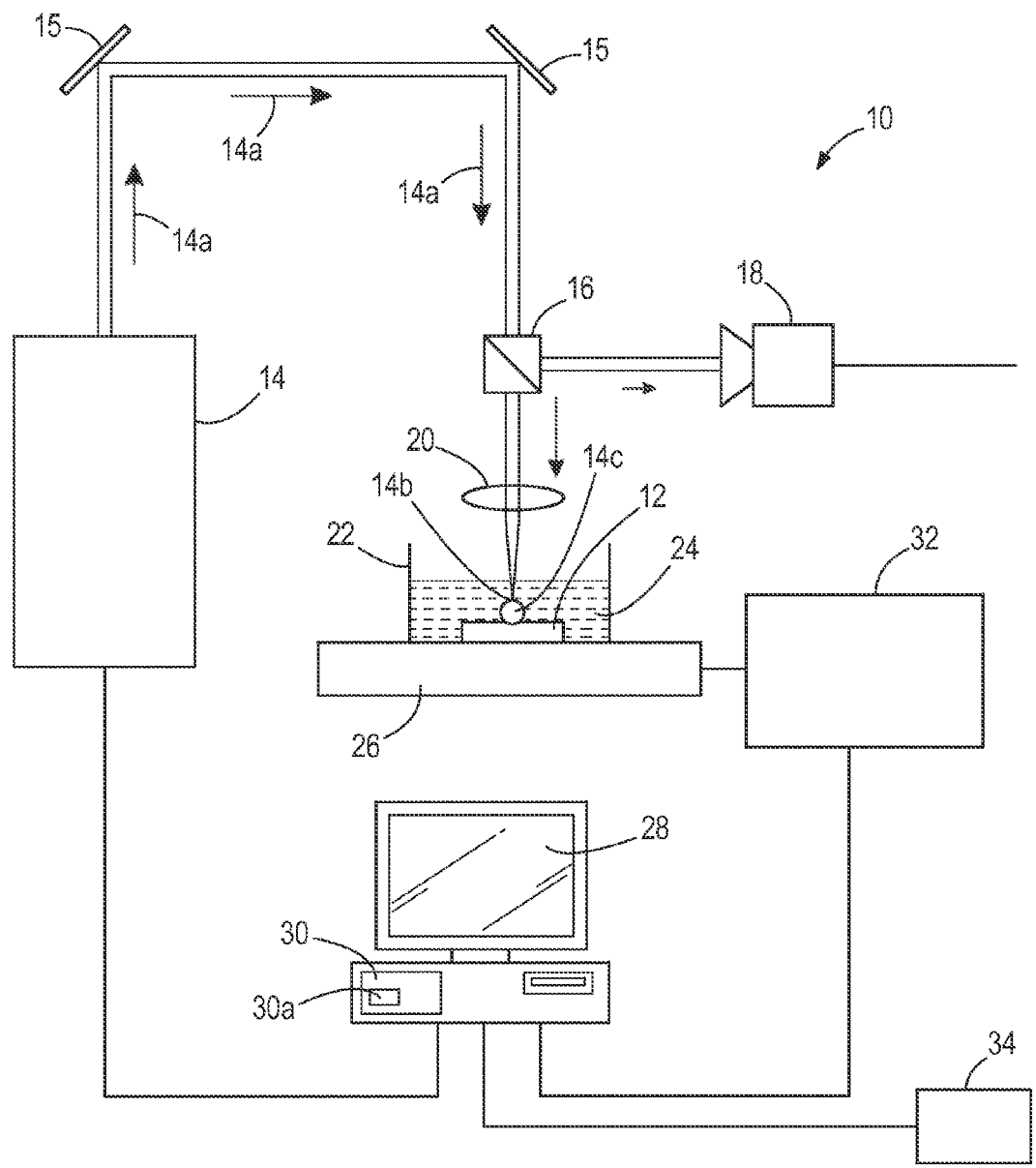
FIG. 1 illustrates a box diagram of one embodiment of a system for laser-induced plasma micromachining of a work-piece.

FIG. 1 illustrates a box diagram of one embodiment of a system 10 for laser-induced plasma micromachining of a work-piece 12. The system 10 comprises a laser 14, turning mirrors 15, a beam-splitter 16, a camera or sensor 18, a focusing lens 20, a dielectric fluid supply device 22, a dielectric fluid 24, a movement stage 26, a processor 28, a memory 30, a motion controller and amplifier 32, and a display device 34. In other embodiments, one or more components of the system 10 may be varied in type or in function, one or more components of the system 10 may be eliminated, or one or more additional components may be added.

The laser 14 emits a laser-beam 14a. In a preferred embodiment, the laser-beam 14a has a wavelength in a visible range of 400 to 700 nanometers, a pulse duration in a range of 1 ps to 1 ns, a pulse frequency in a range of 10 kHz to 50 kHz, a peak power of greater than $10^{11}$ W/cm$^2$, and a cross-section having a Gaussian intensity distribution. These parameters have been found to provide unexpectedly good results in laser-induced plasma micromachining (LIPMM) of the work-piece 12 by providing a micromachined end-product of the highest quality and accuracy in the most efficient time thereby saving cost. In other embodiments, the laser-beam 14a may vary in wavelength pulse duration, pulse frequency, peak power, intensity, or in other parameters.

The turning mirrors 15 turn the laser-beam 14a and direct it to the beam-splitter 16. The beam-splitter 16 splits the laser-beam 14a to the camera or sensor 18 and to the focusing lens 20. In one embodiment, the beam-splitter 16 splits 99% of the laser-beam 14a to the focusing lens 20 and 1% of the laser-beam 14a to the camera or sensor 18. In other embodiments, the beam-splitter 16 may split the laser-beam 14a in varying amounts to a variety of components. The focusing lens 20 focuses the laser-beam 14a at a focal point 14b within the dielectric fluid 24 disposed within the dielectric fluid supply device 22. The dielectric fluid 24 may comprise distilled water, saline water, kerosene, or another type of dielectric fluid. In this embodiment the dielectric fluid supply device 22, comprising a bucket, holds/contains the work-piece 12 in the dielectric fluid 24 held/disposed within the dielectric fluid supply device 22. In other embodiments, the dielectric fluid supply device 22 may vary in type or function.

Figure 2:
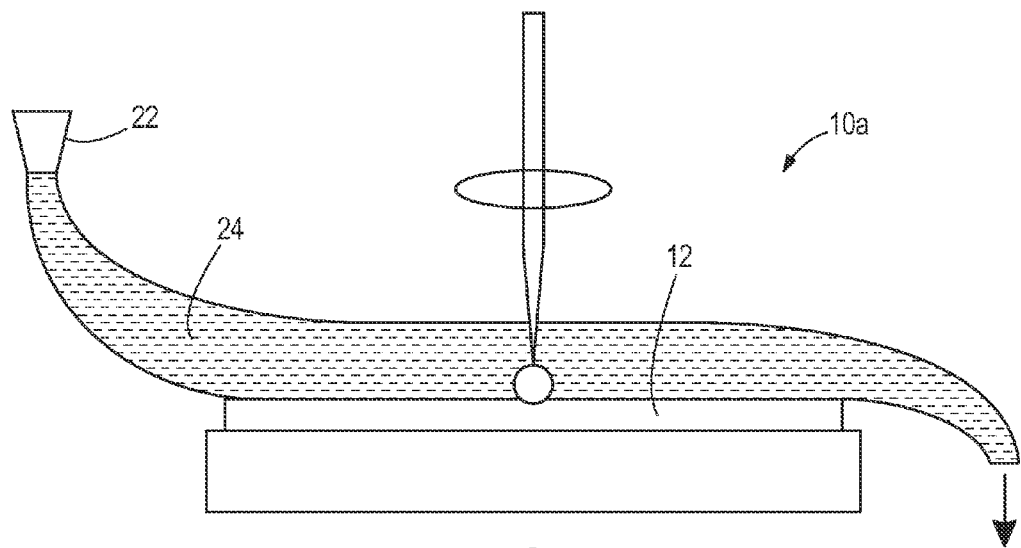
FIG. 2 illustrating a box diagram of another embodiment of a system for laser-induced plasma micromachining of a work-piece.

For instance, in another embodiment shown in FIG. 2 illustrating a box diagram of another embodiment of a system 10a for laser-induced plasma micromachining of a work-piece 12, the dielectric fluid supply device 22 comprises a nozzle which directs the dielectric fluid 24 onto the work-piece 12. The system 10a is identical to the system 10 of FIG. 1 with the exception that the dielectric fluid supply device 22 comprises a nozzle supplying the dielectric fluid 24 onto the work-piece 12 rather than a bucket. For ease of illustration some of the components of FIG. 1 have been omitted from FIG. 2. The use of a nozzle for the dielectric fluid supply device 22 provides an advantage in not limiting the size of the work-piece 12 by the size of the dielectric fluid supply device 22, thereby allowing for the micromachining of as large of a work-piece 12 as desired.

Returning to the embodiment of FIG. 1, the dielectric fluid supply device 22 is disposed on the movement stage 26. The movement stage 26 may comprise a 3-axis motion which moves the dielectric fluid supply device 22 and the work-piece 12 held within it relative to the laser-beam 14a in order to micromachine the work-piece 12 in X, Y, and Z axes. In other embodiments, the movement stage 26 may be attached to the laser 14, the beam-splitter 16, the camera or sensor 18, and the focusing lens 20 in order to move the laser-beam 14a relative to the work-piece 12 in order to micromachine the work-piece 12 in X, Y, and Z axes. In still additional embodiments, the movement stage 26 may vary further.

The processor 28 is in electronic communication with the laser 14, the beam-splitter 16, the camera or sensor 18, the focusing lens 20, the movement stage 26, the memory 30, the motion controller and amplifier 32, and the display device 34 in order to control these components. The memory 30 contains programming code 30a for execution by the processor 28. The programming code directs the laser 14 to deliver the laser-beam 14a into the dielectric fluid 24 to create a plasma 14c generated at the focal point 14b of the laser-beam 14a in the dielectric fluid 24 to micromachine, using the plasma 14c, the work-piece 12 disposed adjacent to the focal point 14b. The work-piece 12 is disposed a few microns below the focal point 14b. In other embodiments, the work-piece 12 may be disposed varying distances away from the focal point 14b. When high-intensity (>$10^{11}$ W/cm$^2$) laser-beam pulses 14a are tightly focused onto the dielectric fluid 24, the dielectric fluid 24 instantaneously de-ionizes, generating dense and optically absorbing plasma 14c at the focal point 14b.

When a spot laser 14 is used to create spot plasma 14c to perform micromachining by placing the work-piece 12 to be machined near the focal point 14b of the spot plasma 14c it is called spot-laser induced plasma micro machining (S-LIPMM). This process does not require any physical tooling to micromachine the work-piece 12 but rather only requires the dielectric fluid 24. When a line laser 14 is used to create line plasma 14c to perform micromachining by placing the work-piece 12 to be machined near the focal point 14b of the line plasma 14c, called line-based laser induced plasma micromachining (L-LIPMM), productivity is significantly enhanced when machining long channels over a large area of the work-piece 12.

The camera or sensor 18 may comprise a charge-coupled device (CCD), or another type of camera or sensor. The camera or sensor 18 is configured to view or determine a location of the focal point 14b relative to the work-piece 12 using the processor 28. The display device 32 may display an image or other information regarding the focal-point 14b of the laser-beam 14a and/or of the work-piece 12. In other embodiments, the processor 28 may display an image or other information regarding the focal-point 14b of the laser-beam 14a and/or of the work-piece 12.

The motion controller and amplifier 32 assists the processor 28 in controlling the movement stage 26. In other embodiments, the motion controller and amplifier 32 may assist the processor 28 in controlling movement of any of the components of the system 10. In other embodiments, alternative components may assist the processor 28 in controlling movement of the system 10. The processor 28 may control movement of the focal point 14b of the laser-beam 14a using the focusing lens 20, may control movement of the work-piece 12 relative to the laser-beam 14a using the movement stage 26, or may control movement of the laser-beam 14a relative to the work-piece 12 using the movement stage 26 in order to control the dimensions of the micromachined area in the work-piece 12 in X, Y, and Z directions.

The size or intensity of the plasma 14c may be controlled by varying the type (i.e. size, shape, configuration, number, etc.) of lens through which the laser-beam 14a is emitted. Additionally, the dielectric fluid 24 may be changed to a second dielectric fluid to vary an energy of the plasma 14c. Moreover, a salinity of the dielectric fluid 24 may be changed using a salinity altering chemical, or by varying the dielectric fluid 24, to vary an intensity of the plasma 14c. Further, in other embodiments, one or more magnets (as shown in other figures herein) may be disposed adjacent the focal point 14b to control a size of the plasma 14c thereby controlling the dimensions of the micromachining of the work-piece 12. In still other embodiments, a size, intensity, or energy of the plasma 14c may be controlled using a variety of methods and components in order to control the dimensions of the micromachining of the work-piece 12.

Figure 3:
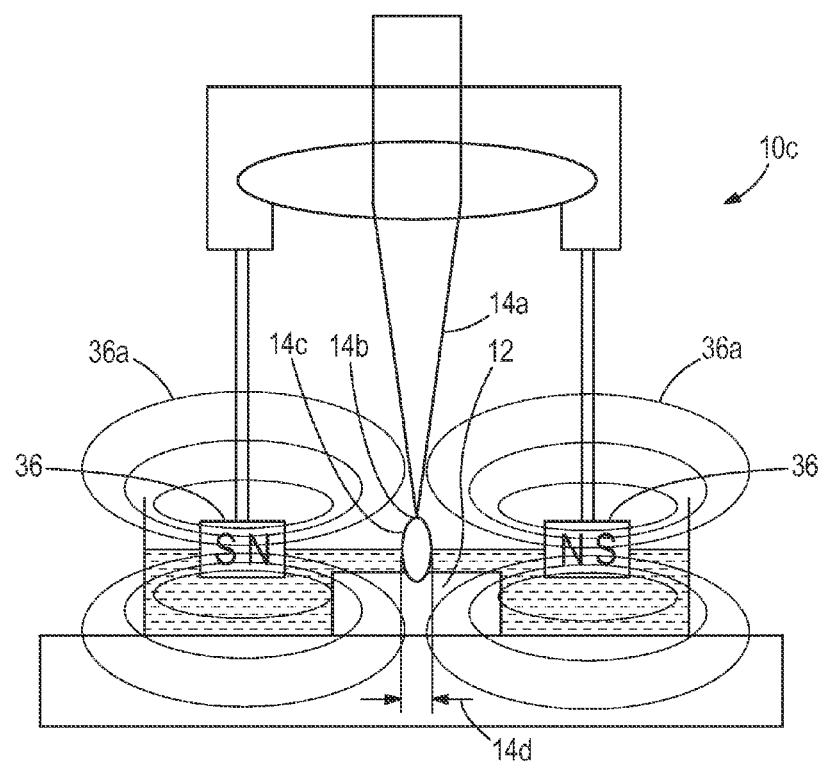
FIG. 3 illustrates a box diagram of still another embodiment of a system for laser-induced plasma micromachining of a work-piece.

FIG. 3 illustrates a box diagram of still another embodiment of a system 10c for laser-induced plasma micromachining of a work-piece 12. The system 10c is identical to the system 10 of FIG. 1 with the exception that magnets 36 are disposed adjacent the focal point 14b of the laser-beam 14a to control a size of the plasma 14c thereby controlling the dimensions of the micromachining of the work-piece 12. For ease of illustration some of the components of FIG. 1 have been omitted from FIG. 3. The magnets 36 may comprise electromagnets. The magnets 36 are disposed on opposed sides of the work-piece 12 and the plasma 14c to confine the plasma 14c (which has an inherent magnetic field) between the magnetic lines of force 36a of the magnets 36 so that the plasma 14c has a shorter distance 14d than it otherwise would have had without the magnets 36. In such manner, by placing magnets 36 on opposed sides (or ends) of the work-piece 12 and the plasma 14c a length or a width of the plasma 14c may be reduced in the X or Y directions. In other embodiments, one or more magnets 36 may be disposed in a variety of locations/configurations relative to the work-piece 12 and the plasma 14c in order to control the size of the plasma 14c thereby controlling the X, Y, and Z dimensions of the micromachining of the work-piece.

Figure 4:
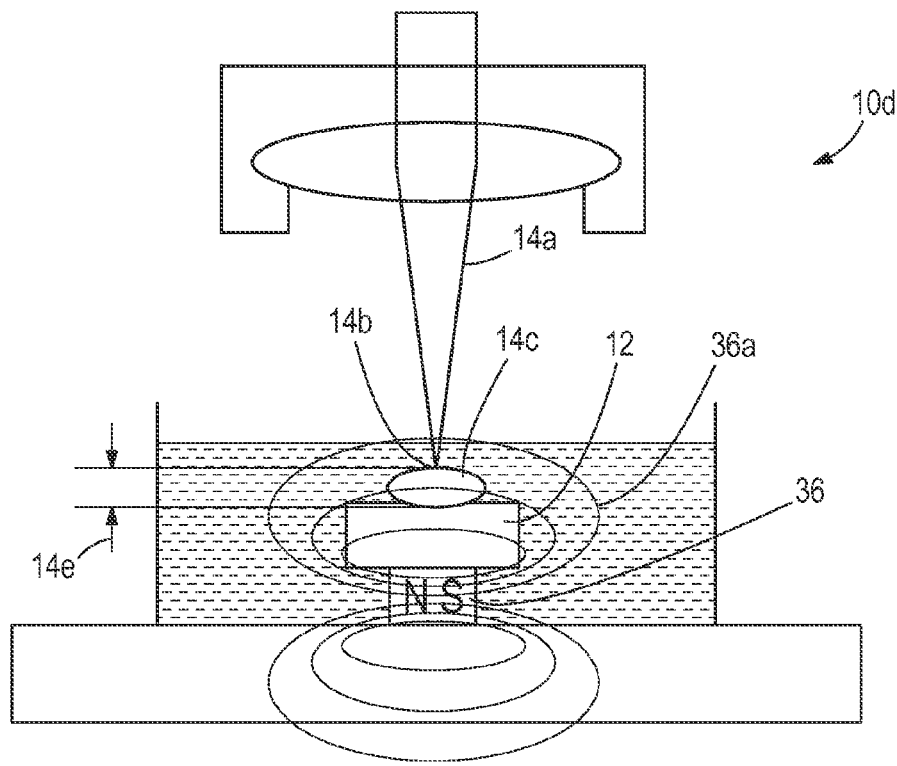
FIG. 4 illustrates a box diagram of still another embodiment of a system for laser-induced plasma micromachining of a work-piece.

FIG. 4 illustrates a box diagram of still another embodiment of a system 10d for laser-induced plasma micromachining of a work-piece 12. The system 10d is identical to the system 10 of FIG. 1 with the exception that a magnet 36 is disposed adjacent the focal point 14b of the laser-beam 14a to control a size of the plasma 14c thereby controlling the dimensions of the micromachining of the work-piece 12. For ease of illustration some of the components of FIG. 1 have been omitted from FIG. 4. The magnet 36 may comprise an electromagnet. The magnet 36 is disposed below the work-piece 12, the focal point 14b, and the plasma 14c to elongate the plasma 14c due to the magnetic lines of force 36a of the magnet 36 so that the plasma 14c has a longer distance 14e than it otherwise would have had without the magnet 36. In such manner, by placing a magnet 36 below or above the work-piece 12 and the plasma 14c a height of the plasma 14c may be reduced in the Z direction. In other embodiments, one or more magnets 36 may be disposed in a variety of locations/configurations relative to the work-piece 12 and the plasma 14c in order to control the size of the plasma 14c thereby controlling the dimensions of the micromachining of the work-piece 12 in X, Y, and Z directions.

Figure 5:
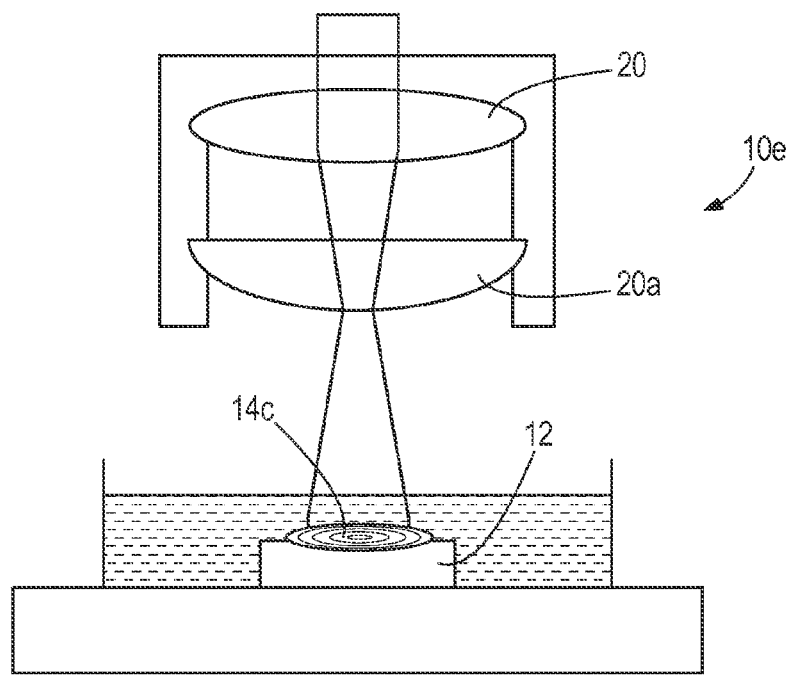
FIG. 5 illustrates a box diagram of still another embodiment of a system for laser-induced plasma micromachining of a work-piece.

FIG. 5 illustrates a box diagram of still another embodiment of a system 10e for laser-induced plasma micromachining of a work-piece 12. The system 10e is identical to the system 10 of FIG. 1 with the exception that a second lens 20a is spaced apart and below from the focusing lens 20 to control a size or intensity of the plasma 14c thereby controlling the dimensions of the micromachining of the work-piece 12. For ease of illustration some of the components of FIG. 1 have been omitted from FIG. 5. The second lens 20a comprises a plano-convex cylindrical lens. Use of this arrangement forces the width of the plasma 14c to be less than the length of the plasma 14c. In such manner, by utilizing a second lens 20a of this shape placed below the focusing lens 20 a width of the plasma 14c may be reduced.

In other embodiments, varying shaped second lens 20a may be disposed in a variety of locations/configurations relative to focusing lens 20 in order to control the size (reduce or enlarge) of the plasma 14c thereby controlling the dimensions of the micromachining of the work-piece. For instance, if the shape of the second lens 20a is changed to a plano-concave shape spaced below the focusing lens 20, the width of the plasma 14c becomes longer than the length of the plasma 14c. Moreover, changing the distance the second lens 20a is disposed apart from the focusing lens 20 further allows manipulation of the width to length ratio of the plasma 14c.

Figure 6:
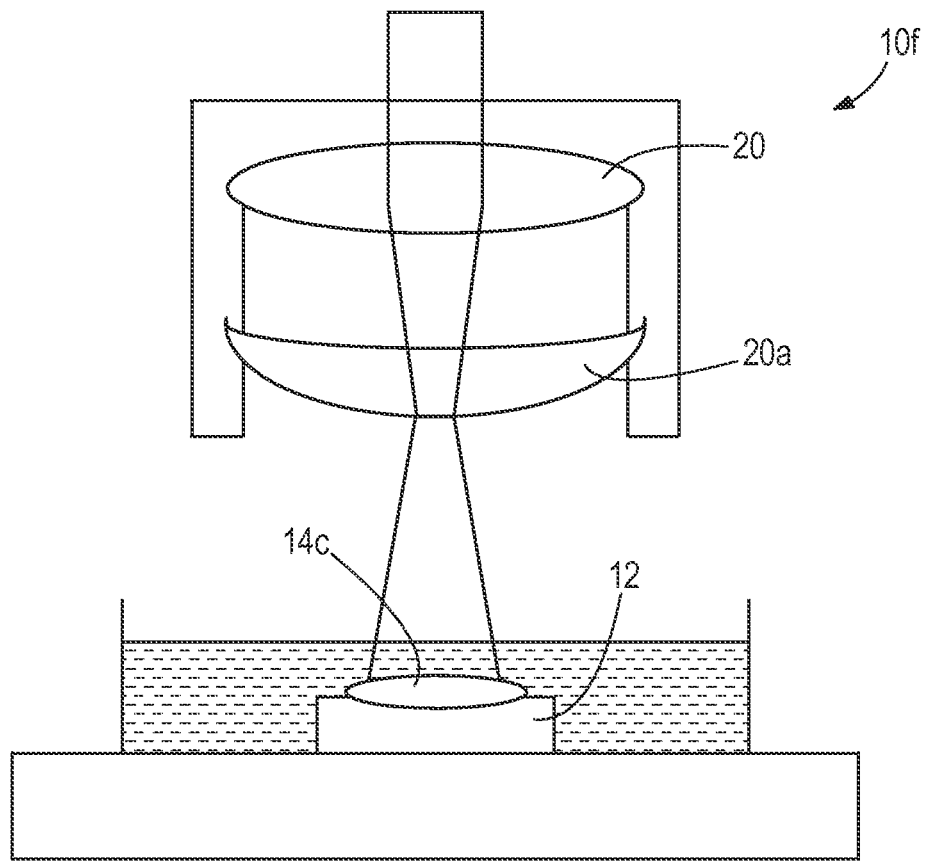
FIG. 6 illustrates a box diagram of still another embodiment of a system for laser-induced plasma micromachining of a work-piece.

FIG. 6 illustrates a box diagram of still another embodiment of a system 10f for laser-induced plasma micromachining of a work-piece 12. The system 10f is identical to the system 10 of FIG. 1 with the exception that a second lens 20a is spaced apart and below from the focusing lens 20 to control the size or intensity of the plasma 14c thereby controlling the dimensions of micromachining of the work-piece 12. For ease of illustration some of the components of FIG. 1 have been omitted from FIG. 6. The second lens 20a comprises an acylindrical convex lens. Use of this arrangement forces the width of the plasma 14c to be less than the length of the plasma 14c and additionally forces the plasma 14c to have a uniform intensity. In such manner, by utilizing a second lens 20a of this shape placed below the focusing lens 20 a width of the plasma 14c may be reduced while providing a uniform intensity of the plasma 14c along its length.

In other embodiments, varying shaped second lens 20a may be disposed in a variety of locations/configurations relative to focusing lens 20 in order to control the size (reduce or enlarge) and the intensity (reduce or enlarge) of the plasma 14c thereby controlling the dimensions of the micromachining of the work-piece. For instance, if the shape of the second lens 20a is changed to an acylindrical concave shape spaced below the focusing lens 20, the width of the plasma 14c becomes longer than the length of the plasma 14c while providing a uniform intensity of the plasma 14c. Moreover, changing a distance the second lens 20a is disposed apart from the focusing lens 20 further allows manipulation of the width to length ratio of the plasma 14c.

Figure 7:
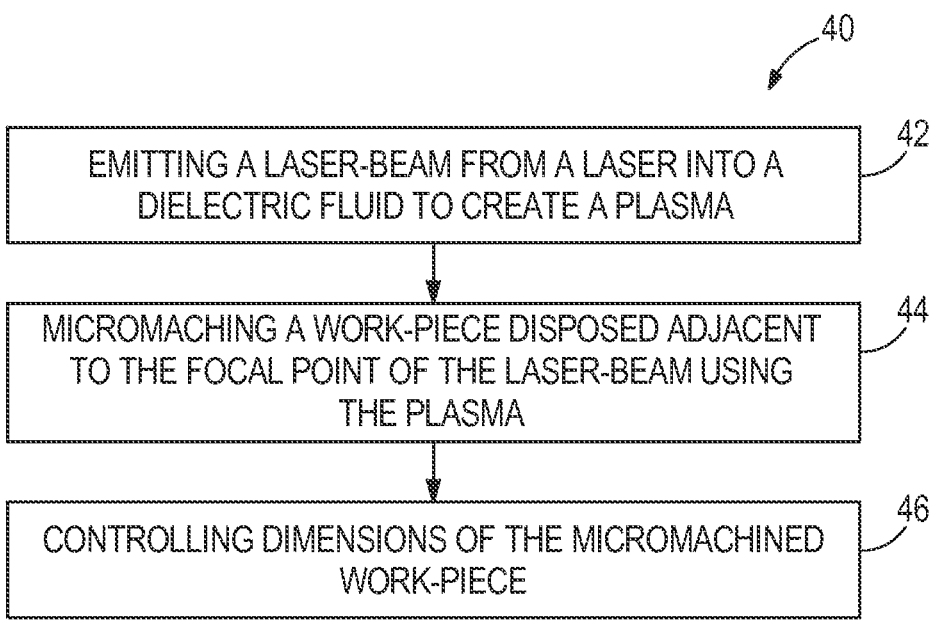
FIG. 7 illustrates a flowchart showing one embodiment of a method of micromachining a work-piece.

FIG. 7 illustrates a flowchart showing one embodiment of a method 40 of micromachining a work-piece. Any of the systems of the instant disclosure may be utilized in the method 40. In other embodiments, varying systems may be utilized in implementing the method 40. In step 42, a laser-beam is emitted from a laser into a dielectric fluid thereby creating a plasma at a focal point of the laser-beam in the dielectric fluid. In step 44, a work-piece disposed adjacent to the focal point is micromachined using the plasma. In step 46, dimensions of the micromachined work-piece are controlled.

In one embodiment, step 46 comprises moving the laser beam relative to the work-piece, or moving the work-piece relative to the laser beam in order to control the dimensions of the micromachined work-piece. This may be achieved using a 3-axis movement stage or by using another type of component.

In another embodiment, step 46 comprises utilizing at least one magnet to control a size of the plasma in order to control the dimensions of the micromachined work-piece. This may be achieved by disposing a varying number of magnets of varying strength at different orientations/configurations/distances relative to the focal-point of the laser beam in the plasma and the work-piece.

In still another embodiment, step 46 comprises varying the size or intensity of the plasma by varying a type (i.e. size, shape, configuration, number of lenses, etc.) of a lens through which the laser is emitted in order to control the dimensions of the micromachined work-piece.

In an additional embodiment, step 46 comprises changing the dielectric fluid to a second dielectric fluid to vary the energy of the plasma in order to control the dimensions of the micromachined work-piece.

In an additional embodiment, step 46 comprises changing the salinity of the dielectric fluid to vary an intensity of the plasma in order to control the dimensions of the micromachined work-piece.

In other embodiments, one or more steps of the method 40 may be modified in substance or in order followed, one or more steps of the method 40 may not be followed, or one or more additional steps may be added to the method 40.

The disclosure solves the problem of having a technology for micromachining that is simultaneously tool-less, multi-material, highly flexible, and has high throughput for texturing of large surfaces with micron sized features. The disclosure may be used for many applications such as: texturing and patterning of biomedical implants used for improving the osseogeneration capacity implants via increasing the active surface area available; reducing wear in biomedical implants made with non-metallic materials; improving the adherence of algae onto large metallic surfaces for getting biofuel from cultured algae; improving the light trapping properties of silicon based photovoltaic solar cells to improve solar cell efficiency; microfluidics based devices used for materials synthesis via multiphase flow mechanics, tissue engineering, and cell mechanobiology studies; inexpensive and portable lab-on-chip devices for point-of-care diagnostics; microchannel machining on fuel cells to increase the actively available area for chemical reactions to occur and therefore increase fuel cell yield; micromolds made on high density polyethylene, polydimethylsiloxane, and bulk metallic glass by transferring patterns onto surfaces that are not photo-definable; and many other applications.

Laser induced plasma micromachining using a dielectric fluid is simple to implement, does not require complicated masks or gas chambers, and works with multiple materials using the same hardware setup. Using a line laser instead of a spot laser to generate line plasma in a dielectric fluid and then to use the line plasma for machining increases the throughput of the micromachining process by up to an order of magnitude. Additionally, laser-induced plasma micromachining can be used to machine shiny (reflective) as well as transparent materials like glass and quartz, as well as materials with high ablation threshold such as ceramics which are difficult to machine with conventional laser based machining processes without significant loss in productivity.

Furthermore, the use of concentrated and localized plasma, instead of direct laser ablation or diffused plasma with masks to perform machining, provides the ability to not only use a highly concentrated source of energy for machining but also to manipulate it via one or more magnetic fields for in-situ control of the machine feature geometry such as providing control over the depth of the plasma, the shape of the plasma, and the position of the plasma to accurately control the X, Y, and Z dimensions of the machined work-piece. This makes laser induced plasma micromachining a truly multi-material, high throughput and flexible micromachining process. Moreover, the use of 3-axis movement stages, varying type lens, varying dielectric fluids, and varying the salinity of the dielectric fluid provides improved control and accuracy in micromachining the work-piece.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the disclosure is defined by the appended claims. Accordingly, the disclosure is not to be restricted except in light of the appended claims and their equivalents.

The invention claimed is:

1. A system for laser-induced plasma micromachining of a work-piece comprising:
   a dielectric fluid;
   a dielectric fluid supply device to hold a work-piece in the dielectric fluid or to direct the dielectric fluid onto the work-piece;
   a laser to emit a pulsed laser-beam;
   a processor in electronic communication with the laser; and
   a memory in electronic communication with the processor, wherein the memory comprises programming code for execution by the processor, and the programming code is programmed to direct the laser to deliver the pulsed laser-beam into the dielectric fluid to create a plasma generated at a focal point of the pulsed laser-beam in the dielectric fluid to micromachine, using the plasma, the work-piece disposed adjacent to the focal point.

2. The system of claim 1 wherein the dielectric fluid supply device comprises a bucket.

3. The system of claim 1 wherein the dielectric fluid supply device comprises a nozzle.

4. The system of claim 1 further comprising a 3-axis movement stage to move the work-piece relative to the pulsed laser-beam or to move the pulsed laser-beam relative to the work-piece.

5. The system of claim 1 further comprising a sensor or camera to determine or view a location of the focal point.

6. The system of claim 1 further comprising at least one magnet disposed adjacent the focal point to control a size of the plasma.

7. The system of claim 1 further comprising a focusing lens and a second lens spaced apart from the focusing lens to control a size or intensity of the plasma.

8. The system of claim 7 wherein the second lens is convex or concave.

9. The system of claim 8 wherein the second lens is convex.

10. The system of claim 1 further comprising a second dielectric fluid to change the dielectric fluid to the second dielectric fluid to vary energy of the plasma.

11. The system of claim 1 further comprising a salinity altering chemical for changing a salinity of the dielectric fluid to vary an intensity of the plasma.

12. A system for laser-induced plasma micromachining of a work-piece comprising:
    a dielectric fluid;
    a dielectric fluid supply device to hold a work-piece in the dielectric fluid or to direct the dielectric fluid onto the work-piece;

a laser to emit a laser-beam, wherein the laser beam has a wavelength in a visible range, a pulse duration in a range of 1 ps to 1 ns, a pulse frequency of 10 kHz to 50 kHz, and a peak power of greater than 10$^{11}$ W/cm$^2$;

a processor in electronic communication with the laser; and a memory in electronic communication with the processor, wherein the memory comprises programming code for execution by the processor, and the programming code is programmed to direct the laser to deliver the laser-beam into the dielectric fluid to create a plasma generated at a focal point of the laser-beam in the dielectric fluid to micromachine, using the plasma, the work-piece disposed adjacent to the focal point.

13. The system of claim 12 wherein the laser beam has a cross-section having a Gaussian intensity distribution.

14. The system of claim 12 wherein the dielectric fluid comprises distilled water, saline water, or kerosene.

* * * * *